United States Patent [19]
Ushirogouchi et al.

[11] Patent Number: 5,853,952
[45] Date of Patent: Dec. 29, 1998

[54] COLOR DEVELOPING ORGANIC MATERIAL, COLOR DEVELOPING RESIN COMPOSITION AND COLORED THIN FILM PATTERN

[75] Inventors: Toru Ushirogouchi, Yokohama; Makoto Nakase, Tokyo; Akira Yoshizumi, Yokohama; Naoko Kihara, Matsudo; Takuya Naito, Tokyo; Naomi Shida; Koji Asakawa, both of Kawasaki, all of Japan

[73] Assignee: Kabushiki Kaisha Toshiba, Kawasaki, Japan

[21] Appl. No.: 705,265

[22] Filed: Aug. 29, 1996

[30] Foreign Application Priority Data

Aug. 30, 1995 [JP] Japan .................................... 7-222347

[51] Int. Cl.$^6$ .............................. G03C 1/73; C08G 12/06
[52] U.S. Cl. ...................... 430/270.1; 430/292; 430/332; 430/338; 430/962; 528/269
[58] Field of Search ................... 430/270.1, 292, 430/332, 338, 962; 528/269

[56] References Cited

U.S. PATENT DOCUMENTS

| 4,501,876 | 2/1985 | Zahr | 528/232 |
|---|---|---|---|
| 4,656,126 | 4/1987 | Kato et al. | 430/559 |
| 4,719,171 | 1/1988 | Ikenaga et al. | 430/271.1 |
| 4,772,534 | 9/1988 | Kawamura et al. | 430/270.1 X |
| 4,921,872 | 5/1990 | Heidenreich et al. | 514/523 |
| 4,959,252 | 9/1990 | Bonnebat et al. | 428/64 |
| 5,064,741 | 11/1991 | Koike et al. | 430/270.1 |
| 5,066,765 | 11/1991 | Wada et al. | 528/185 |
| 5,512,641 | 4/1996 | Ezaki | 525/504 |
| 5,523,027 | 6/1996 | Otsuka | 252/589 |

FOREIGN PATENT DOCUMENTS 7-72323   3/1995   Japan .

*Primary Examiner*—Bernard P. Codd
*Attorney, Agent, or Firm*—Oblon, Spivak, McClelland, Maier & Neustadt, P.C.

[57] ABSTRACT

There is disclosed a color developing resin composition comprising a base polymer, a dialdehyde represented by the general formula OHC—$R^{1'}$—CHO, a diamine represented by the general formula $H_2N$—$R^{2'}$—$NH_2$ (at least one of $R^{1'}$ and $R^{2'}$ is an aromatic group), a compound which produces an acid by light irradiating and a resin which is crosslinked with the acid.

5 Claims, No Drawings

COLOR DEVELOPING ORGANIC MATERIAL, COLOR DEVELOPING RESIN COMPOSITION AND COLORED THIN FILM PATTERN

BACKGROUND OF THE INVENTION

1. Field of the Invention

The present invention relates to a color developing organic material, a color developing resin composition and a colored thin film pattern formed by using the color developing resin composition.

2. Description of the Related Art

As organic recording materials using a change in state due to light or heat, those using phase separation of a polymer blend or phase transition of a liquid crystal material have hitherto been known. However, these conventional organic recording materials have a problem that a response speed is generally slow and, therefore, an improvement in response speed has been requested.

As a compound having a conductivity wherein light absorption thereof changes by oxidation/reduction, for example, there has been known a polyaniline synthesized by electrolytic polymerization. However, this electrolytic polymerization reaction proceeds only on the electrode surface and, therefore, a production efficiency of the polyaniline is inferior. Also, since the polyaniline has a very low solubility in a solvent, it is difficult to form a film by dissolving it in the solvent.

In a liquid crystal device or an image pickup device, a color filter and a shielding membrane (black matrix) are used. In order to form them, various materials and processes corresponding to them are used. For example, a process of dyeing a resist after patterning is known so as to form the color filter. However, this process has very complicated steps and it is hard to improve an yield. The black matrix is generally formed by using a metal such as chrome. In this case, however, exposing and developing of the resist as well as etching of chrome are required and, therefore, the production efficiency is low. Therefore, in order to form the color filter and black matrix, it has been studied to use a colored resist containing a pigment. However, the pigment contained in the colored resist essentially have a property of absorbing light and, therefore, a resolution and a sensitivity of the resist are deteriorated. Furthermore, a device having a faulty color filter and black matrix has a problem that a luminance and a contrast are deteriorated.

SUMMARY OF THE INVENTION

It is an object of the present invention to provide a color developing organic material capable of controlling color developing and decoloring at a comparatively fast response speed, utilizing a chemical reaction. It is a further object of the present invention to provide a color developing resin composition capable of forming a film easily and also capable of patterning it. It is a yet another object of the present invention to provide a colored thin film pattern formed by using the color developing resin composition.

The color developing organic material of the present invention consists of a compound having an azomethine bond formed by a condensation reaction between an aldehyde and an amine, which performs color developing by oxidizing or heating and decoloring by reducing or cooling.

The color developing resin composition of the present invention comprises a base polymer and a compound having an azomethine bond formed by a condensation reaction between an aldehyde and an amine.

The color developing resin composition of the present invention comprises a base polymer, an aldehyde represented by the general formula $R^1$—CHO and an amine represented by the general formula $R^2$—$NH_2$, wherein at least one of $R^1$ and $R^2$ is an aromatic group. A compound which produces an acid by light irradiating or heating (acid generator) may be optionally added to the color developing resin composition. In addition to the acid generator, a resin which is crosslinked or decomposed with the acid may be added.

A colored thin film pattern of the present invention is produced by the process comprising the steps of forming a thin film of a resin composition containing an aldehyde, an amine, a compound which produces an acid by light irradiating and a resin which is crosslinked or decomposed with the acid, on a substrate; exposing and developing the thin film to form a thin film pattern; and oxidizing or heating the thin film pattern to perform color developing.

DETAILED DESCRIPTION OF THE PREFERRED EMBODIMENTS

The present invention will be described in detail, hereinafter.

The color developing organic material of the present invention consists of a compound having an azomethine bond formed by a condensation reaction between an aldehyde and an amine.

The aldehyde and amine, a raw material of the color developing organic material of the present invention, are respectively represented by the following general formulas (I) and (II):

$R^1$—CHO    (I)

$R^2$—$NH_2$    (II)

wherein at least one of $R^1$ and $R^2$ is an aromatic group.

As the raw material of the color developing organic material of the present invention, there may be used a dialdehyde and a diamine, which are represented by the following general formulas (III) and (IV):

OHC—$R^{1'}$—CHO    (III)

$H_2N$—$R^{2'}$—$NH_2$    (IV)

wherein at least one of $R^{1'}$ and $R^{2'}$ is an aromatic group.

One of $R^1$ and $R^2$ in the general formulas (I) and (II) or $R^{1'}$ and $R^{2'}$ in the general formulas (III) and (IV) may be an aliphatic group.

Examples of the aromatic group which can be used as $R^1$, $R^2$, $R^{1'}$ and $R^{2'}$ will be described below. One or more hydrogen atoms of the aromatic ring of the aromatic group described below may be substituted with a hydroxyl group or an alkyl group such as methyl group.

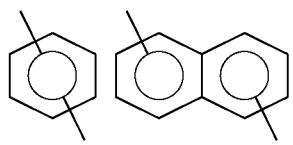

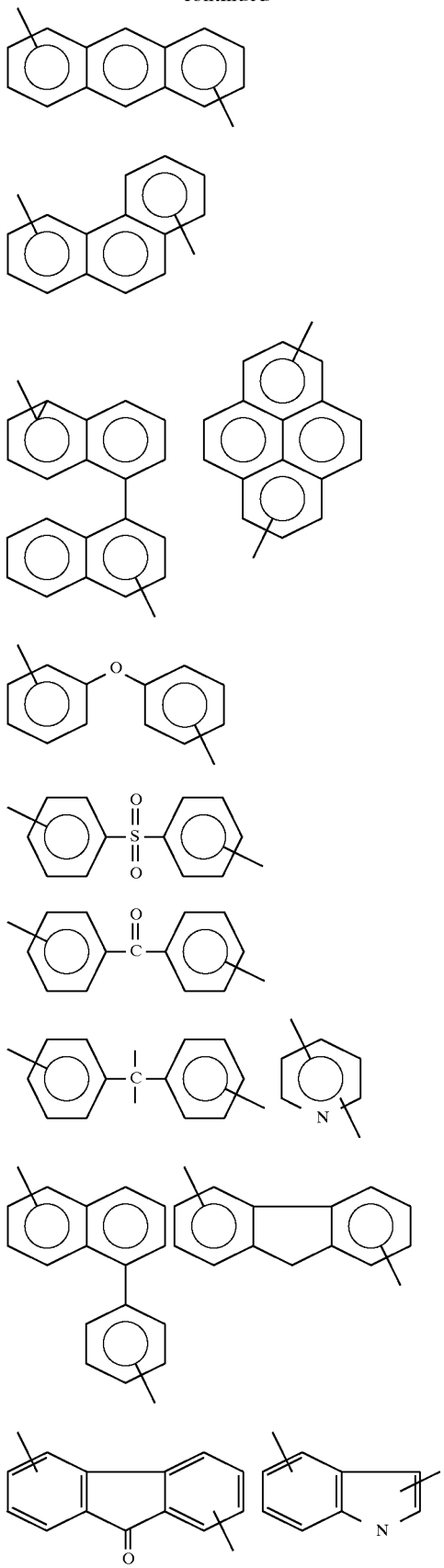
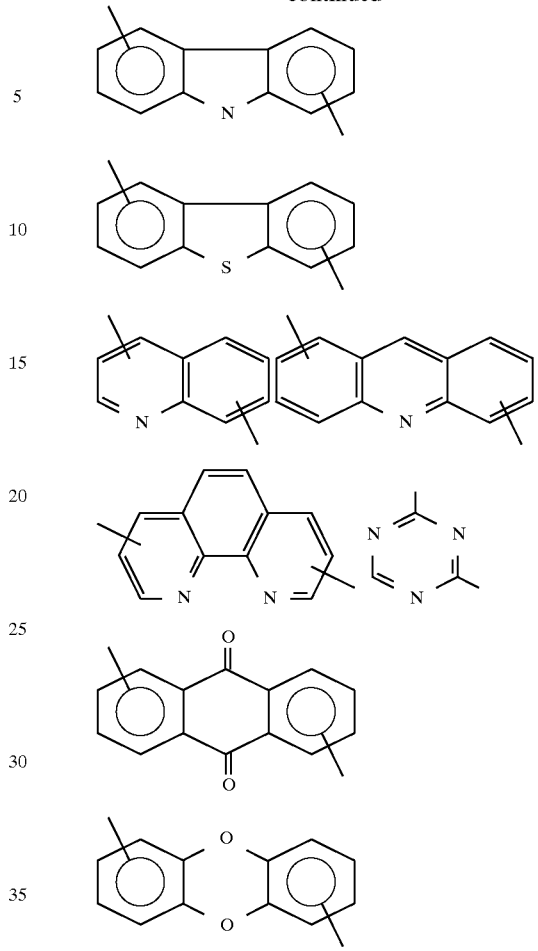

Specific examples of the monoaldehyde represented by the general formula (I) include 2-naphthoaldehyde. Specific examples of the monoamine represented by the general formula (II) include 2-aminopyrene. Specific examples of the dialdehyde represented by the general formula (III) include phthalic dicarbaldehyde, 5-formylsalicylaldehyde, 2-hydroxy-5-methylisophthalaldehyde, 2,3-naphthalenedicarbaldehyde, etc. Specific examples of the diamine represented by the general formula (IV) include benzene diamine derivatives such as phenylenediamine; naphthalene diamine derivatives such as 1,5-diaminonaphthalene; and aromatic diamines having a plurality of aromatic rings such as diaminodiphenyl ether and diaminostilbene.

As the raw material of the color developing organic material of the present invention, there may be used a compound having a polyvalent aldehyde group and a compound having a polyvalent amino group, for example, polymers having these functional groups at the side chain.

The color developing organic material obtained from the above dialdehyde and diamine is an oligomer or polymer (polyimine) represented by the general formula:

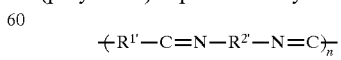

wherein n is an integer of 1 to 50.

In this case, a long-chain conjugated polymer having an azomethine bond can be synthesized by selecting a suitable group as $R^{1'}$ of the dialdehyde and $R^{2'}$ of the diamine.

The principle of color developing in the color developing organic material of the present invention will be explained. The azomethine bond contained in the color developing organic material is represented by —CH=N— and, as described hereinafter, the state thereof changes by oxidation and reduction.

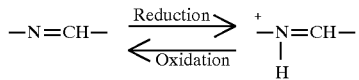

In this case, the color developing organic material performs color developing in the oxidized state and performs decoloring in the reduced state. A light transmittance also changes with a change in light absorption. Sometimes, an electric conductivity also changes. The color developing organic material of the present invention can be used, for example, as a recording material by utilizing a reversible change of color developing and decoloring (writing and erasing). The color developing organic material of the present invention can also be used as a colored thin film such as color filter and black matrix or a write-once type recording material by utilizing only an irreversible color-developed state (writing).

Examples of a process of causing the above change in state include electrolysis, oxidation due to an ion such as As. Among them electrolysis is particularly advantageous in the case of performing color developing and decoloring, because a reversible reaction can be easily conducted. Other processes are generally used in case of irreversible color developing. There can also be used a reversible process of performing color developing by bringing into contact with an acid and decoloring by washing with water.

The color developing organic material of the present invention sometimes shows a reversible change, that is, color developing by heating and decoloring by cooling. It is also possible to maintain the color-developed state by quenching in a cooling process after color developing with heating or formulating into a polymer having comparatively high melting point to accelerate solidification after color developing with heating.

The color developing organic material of the present invention can be applied as a recording material, wherein the recording/erasing process is performed in the following steps: (1) color developing due to oxidizing or heating to perform the writing step, (2) using a change in light transmittance and electric conductivity to perform a reading step, and (3) erasing due to reducing or cooling. The recording material utilizing such a chemical reaction attains a fast response speed in comparison with a conventional recording material utilizing phase separation of a polymer blend or phase transition of a liquid crystal material.

In the color developing organic material of the present invention, the organic group $R^1$ and $R^{1'}$ constituting the aldehyde and organic group $R^2$ and $R^{2'}$ constituting the amine are appropriately selected according to light absorption characteristics to be required. For example, when it is required that the material has light absorption in the region from 200 to 300 nm, it is preferable that one of $R^1$ ($R^{1'}$) and $R^2$ ($R^{2'}$) is a benzene group and another represents a non-aromatic group. When it is required that the material has light absorption in the region from 300 to 400 nm, it is preferable that both of $R^1$ ($R^{1'}$) and $R^2$ ($R^{2'}$) are a benzene group. When it is required that the material has light absorption in the region from 400 nm or more, it is preferable that both of $R^1$ ($R^{1'}$) and $R^2$ ($R^{2'}$) are a benzene group, a polybenzene group or a condensed benzene group such as naphthalene.

The color developing organic material of the present invention can be synthesized, for example, by subjecting the aldehyde and amine to a dehydration condensation reaction in a solvent. Examples of the solvent used in this reaction include ethanol, benzene, toluene, chloroform, etc. In order to conduct the dehydration condensation reaction, there can be used a process of refluxing a reaction solution, a process of distilling off water as azeotropic mixture with a solvent, or a process of using a dehydration catalyst. As the dehydration catalyst, there can be used $TiCl_4$, $ZnCl_4$, molecular sieves, sulfuric acid, etc. The color developing organic material of the present invention is used alone or in a state of being mixed in a low-molecular compound thin film or a base polymer.

Among color developing organic materials of the present invention, those having comparatively high molecular weight wherein a conjugated length (number of double bonds arranged on the plane) exceeds 10 sometimes show very inferior solubility in a solvent. In order to maintain a sufficient solubility in the solvent in spite of molecular weight, for example, it is desired to use an aromatic dialdehyde or diamine having a linkage group such as —O—, —$SO_2$—, —NH—, ester bond and divalent alkyl group, or mix the aromatic dialdehyde or diamine with an aliphatic dialydehyde or a diamine. The high-molecular weight color developing organic material can form a film by coating a solution thereof on any substrate. In this case, a low-molecular weight sulfonyl or sulfonate compound may be formulated so as to improve the uniformity of coating.

On the other hand, in the application where the color developing organic material of the present invention is mixed with the base polymer, followed by processing, and the electric conductivity of the resultant product is utilized, that having a long conjugated length is advantageous. In such an application, an acidic compound, a hydrogen ion, a dopant such as arsenic or metal powder may be added in the base polymer so as to further improve the electric conductivity.

The color developing resin composition of the present invention will be described in detail, hereinafter. The color developing resin composition of the present invention comprises an aldehyde represented by the general formula $R^1$—CHO (I) and an amine represented by the general formula $R^2$—$NH_2$ (II), wherein at least one of $R^1$ and $R^2$ is an aromatic organic group. The aldehyde and amine may be a dialdehyde, a diamine, a polyvalent aldehyde and a polyvalent amine. It is generally preferable to formulate these aldehydes and amines in the base polymer. At least one of the aldehyde and amine may also serve as the base polymer.

In the color developing resin composition of the present invention, when the aldehyde and amine are subjected to the dehydration condensation reaction by oxidizing or heating, a color developing organic material having an azomethine bond is incorporated into the base polymer. Since this color developing resin composition has a good processability, it can be formed into a shape such as thin film and subjected to patterning, thereby causing the dehydration condensation reaction in a state of being patterned. The color developing organic material (particularly high-molecular weight color developing organic material) having an azomethine bond sometimes shows an inferior solubility in a solvent. Such a color developing organic material can not be used in a polymer form. In this case, the color developing resin composition of the present invention is effectively used as the described manner.

It is preferred to use a binder base polymer having a polar group because the reaction field of the aldehyde and amine preferably be a polar field. Examples of the polymer having a polar group include polyvinyl alcohol derivatives such as polyvinyl alcohol, polyvinyl acetal and copolymer of vinyl alcohol and vinyl acetate; maleic acid copolymers such as copolymer of maleic anhydride and methyl vinyl ether; vinyl phenolic resins such as polyvinyl phenol and styrene-vinyl phenol copolymer; novolak resins obtained from phenol, cresol, xylenol and phenol halide; polystyrene sulfonate resins; polyamide resins such as nylon and casein; cellulose resins; polyvinylpyrrolidone resins; polycarbonate resins; polyurethane resins; melamine resins; and acrylic resins.

In the color developing resin composition of the present invention, the amount of the aldehyde and amine formulated in the resin composition is preferably set within the range from 1.5 to 47.5% by weight. This reason is as follows. That is, if the amount is too small, a change of color developing and decoloring of the resin composition is small and, and if the amount is too large, the processability of pattern formation is deteriorated. On the other hand, the amount of the aldehyde and amine may be preferably set at an equimolar amount. When using a monoamine which is easily volatilized, there may be formulated it in an amount which slightly exceeds that of aldehyde.

The color developing resin composition of the present invention can be applied as a recording material utilizing a reversible change of color developing and decoloring and a colored thin film utilizing an irreversibly color-developed state according to the same manner as that described about the color developing organic material. Besides, this resin composition is advantageous because of good processability such as film forming.

A compound which produces an acid by light irradiating or heating (hereinafter referred to as a photo-acid generator, a heat-acid generator or an acid generator) may be incorporated into the color developing resin composition of the present invention. The term "light" used herein should be interpreted into a term representing an electromagnetic wave, which includes any of electron beam, X-ray, ultraviolet ray, visible light and high energy ray (e.g. ion beam, etc.). In the color developing resin composition containing the acid generator, when light is irradiated or heating is performed after the generation of the color developing organic material by subjecting the aldehyde and amine to the dehydration condensation reaction, the azomethine bond becomes the oxidized state by an acid produced from the acid generator and, therefore, color developing can be irreversibly performed.

Examples of the acid generator include onium salt, orthoquinonediazide, sulfonyl compound, sulfonate compound, sulfamine compound, bisulfon compound and organic halide. Specific examples thereof include the followings.

Examples of the onium salt include diazonium salt, phosphonium salt, sulfonium salt and iodonium salt containing a counter ion selected from the group consisting of fluoroborate anion, hexafluoroantimonate anion, hexafluoroarsenate anion, trifluoromethanesulfonate anion, paratoluenesulfonate anion and paranitrotoluenesulfonate anion.

Examples of the quinonediazide compound include a reaction product of polyhydroxybenzophenone and naphthoquinonediazidesulfonyl chloride or naphthoquinonediazidesulfonic acid.

Examples of the sulfonyl compound include sulfonyl compounds having an electron attractive group such as bisphenylsulfonylmethane, phenylsulfonylacetonitrile and phenylsulfonylacetophenone, and diazo compounds thereof.

Examples of the sulfonate compound include pyrogallol trimesylate and triflate, sulfonate compounds having an electron attractive group such as nitro group.

The organic halide is a compound which produces a hydrogen halide acid, and examples thereof include those disclosed in U.S. Pat. Nos. 3,515,552, 3,536,489 and 3,779,778 and German Patent No. 2,243,621A.

An amount of the acid generator formulated relative to the other solid components is not defined because it depends on the production efficiency of the acid, but is normally from 0.01 to 50% by weight, preferably 0.2 to 30% by weight. This reason is as follows. That is, if the amount of the acid generator is less than 0.01% by weight, its coloring efficiency becomes insufficient. On the other hand, if it exceeds 50% by weight, the coating property of the composition is likely to be deteriorated.

In the color developing resin composition of the present invention, a resin which is crosslinked or decomposed with an acid may be formulated, together with an acid generator which produces an acid by light. Such a color developing resin composition serves as a so-called chemical amplification type resist and can form a pattern by exposing and developing. It is possible to cause reversible color developing and decoloring or irreversible color developing, which is derived from the azomethine bond, in the pattern thus formed. The resin which is crosslinked or decomposed by the acid may also serve as the base polymer, or it may be added together with the other base polymer.

Examples of the resin which is crosslinked with the acid (acid crosslinking resin) include those having an OH group, a COOH group or an acetal group which is dehydrated and condensed by the acid. Specific examples thereof include polyvinyl alcohol, acetalized polyvinyl alcohol or vinyl alcohol copolymer; copolymer of maleic anhydride; casein; cellulose; polyamic acid, polyamino acid or acrylic acid copolymer; melamine resin; epoxy resin or modified epoxy resin with dicarboxylic anhydride; and phenolic resin containing an acetal compound.

Examples of the resin which is decomposed with the acid (acid decomposing resin) include copolymer of tertiary butyl methacrylate and methacrylic acid; polyvinyl acetal resin having high acetalization ratio; resin crosslinked with vinyl ether; and tert-butoxycarbonyl compound or tetrahydroxypyranyl ether of a polyhydroxystyrene, phenolic resin such as novolak or a compound having a phenol group.

A sensitizer for the acid generator sensitive to light of longer wavelength than a specific wavelength (particularly 340 nm) may be added to the color developing resin composition of the present invention. Examples of the sensitizer include squarium pigment. A nonionic or ionic surfactant and antistatic agent may be optionally formulated so as to improve the coating properties of the composition.

The color developing resin composition of the present invention is normally used in a state of dissolving or dispersing in water or an organic solvent. Examples of the organic solvent used in this case include polar solvent such as N-methylpyrrolidone, dimethylformamide and dimethyl sulfoxide; and solvent generally used for resist such as ethyl cellosolve acetate, ethyl lactate, polyethylene glycol and propylene glycol monoethyl acetate (PEGMEA).

The sensitivity of the color developing resin composition of the present invention is inhibited by the presence of a trace amount of a strongly basic ion. This reason is considered as follows. That is, an acid is produced from an acid generator by exposing and the acid diffuses by heating in the resin composition, and then the reaction proceeds according to a mechanism that a crosslinking or decomposition reaction arises using the acid as a catalyst. Therefore, it is preferred to avoid inclusion of these strongly basic ions in the process of preparing and treating this composition.

A process for forming a colored thin film pattern which can be used as a color filter or a black matrix of a liquid crystal device or an image pickup device, using the color developing resin composition of the present invention will be described, hereinafter.

In order to produce a colored thin film pattern by using a resin composition containing a base polymer, an aldehyde and an amine and, if necessary, an acid generator, the following process is used. Firstly, a solution of the resin composition is coated on a substrate, which is dried by hot air at 50° to 120° C. or using a hot plate to form a thin film. Then, a resist is formed on this thin film. This resist is exposed through a mask and developed with a developing solution such as alkali solution and organic solvent to form a resist pattern. Furthermore, the thin film exposed from the resist pattern is selectively acid-treated to cause color developing derived from an azomethine bond. A composition developing a black color is used for a black matrix, and a composition developing any color of R, G and B (red, green and blue, respectively) is used for a color filter.

In this process, a thickness of the thin film is appropriately determined according to the application, and is normally set within the range from 0.2 to 50 μm. A process of irradiating ultraviolet ray (wavelength: about 340 nm or 430 nm) using a high-pressure or low-pressure mercury lamp as a light source on exposure is convenient. The irradiation dose is set at 1 to 900 mJ/cm$^2$. As a matter of course, it may also be possible to expose with the other light source by using a sensitizer in combination.

In order to produce a colored thin film pattern by using a resin composition containing a base polymer, an aldehyde, an amine, an acid generator and an acid crosslinking or decomposing resin, the following process is used. Firstly, a solution of the resin composition is coated on a substrate, which is dried by hot air at 50° to 120° C. or using a hot plate to form a thin film. Then, this thin film was exposed through a mask. After exposing, post baking may be performed at 50° to 150° C. for 30 seconds to 60 minutes. Then, a thin film pattern is formed by developing with a developing solution such as alkali solution and organic solvent. In the thin film containing the acid crosslinking resin, crosslinking occurs at the exposed part and it becomes difficult to dissolve in a developing solution and, therefore, the exposed part remains as a pattern. On the other hand, in the thin film containing the acid decomposing resin, decomposition occurs at the exposed part and it becomes easy to dissolve in a developing solution and, therefore, the part other than the exposed part remains as a pattern. Furthermore, the resultant pattern is acid-treated or heated to cause color developing derived from the azomethine bond. Also, in this case, a composition developing a black color is used for the black matrix and a composition developing any color of RGB is used for the color filter. This process is superior to the former process because it is not necessary to use a resist.

The thickness of the thin film and exposure light source are the same as those of the former process. In this process, post baking may be performed at high temperature after forming a pattern. Specifically, the pattern is heated at 140° to 250° C. for 1 minute to 1 hour. It is preferred that the atmosphere is an inert atmosphere such as nitrogen atmosphere. The concentration of the acid contained in the pattern may be increased by irradiating an electromagnetic wave over the whole surface again or the acid may be supplied to the interior of the pattern from a vapor phase, a liquid phase or an other polymer layer before high-temperature post baking. Thus, the thin film pattern containing the acid crosslinking resin is further solidified and weather resistance is extremely improved and, therefore, it is particularly preferred in the application for shielding membrane.

In the above-described process, a final color developing is sometimes caused by formation of an azomethine bond due to the dehydration condensation reaction between the aldehyde and amine, or caused by a change in state of the resultant azomethine bond. In the former case, the thin film is heated to form the azomethine bond after formation of the resist pattern or thin film pattern. In the latter case, the azomethine bond may be formed immediately after formation of the thin film or after formation of the resist pattern or thin film pattern.

EXAMPLES

The following Examples further illustrate the present invention in detail.

Examples 1-1 to 1-6

As the dialdehyde, the following AL1 to AL4 were prepared. As the diamine, the following AM1 to AM4 were prepared. These reagents are manufactured by Aldrich Co.

AL1: 2,3-Naphthalenedicarboxyaldehyde (or 2,3-naphthalenedicarbaldehyde

AL2: 2-Hydroxy-5-methylisophthalaldehyde

AL3: 5-Formylsalicylaldehyde

AL4: Phthalic dicarbaldehyde (or phthaldialdehyde)

AM1: Diaminodiphenyl ether

AM2: 1,5-Naphthalenediamine

AM3: Phenylenediamine

AM4: 3,3'-Diaminobenzophenone

The dialdehyde and diamine (at least one species from the above respective groups) were dissolved in N-methylpyrrolidone (NMP) according to the formulation shown in Table 1 to prepare a solution. In this case, an amount of the dialdehyde and diamine were adjusted so that an aldehyde group and an amino group exist in an equimolar amount. Molecular sieves were charged in the resultant solution and, after refluxing at 70° to 140° C., the solution was filtered to recover a filtrate containing a long-chain conjugated polymer (i.e. polyimine) having an azomethine bond. The results obtained by measuring a maximum absorption wavelength of the resultant respective polymer solutions are shown in Table 1.

Further, the number average molecular weights of resultant polymers are as follows: (1-1) 3500, (1-2) 2500, (1-3) 4000, (1-4) 4500, (1-5) 4000 and (1-6) 3500.

Then, the resultant respective polymers and methylsulfonylacetonitrile were dissolved in NMP in a concentration of 20% by weight and 4% by weight, respectively, followed by filtering to prepare a coating solution. Methylsulfonylacetonitrile is an additive having a function of improving a uniformity of coating. The respective coating solutions were spin-coated on a quartz substrate to form a film having a thickness of 1 μm. The respective films were brought into contact with 5% by weight of sulfuric acid solution and then washed with water. The results obtained by measuring an absorbance after contacting with sulfuric acid that after washing with water are shown in Table 1. As is apparent from the results of Table 1, the respective polymers can realize reversible color developing and decoloring using an acid.

TABLE 1

| | Dialdehyde (mol %) | Diamine (mol %) | Maximum absorption wavelength (nm) | Absorbance After acid treatment | After washing |
|---|---|---|---|---|---|
| Example 1-1 | AL1(50) | AM1(50) | 652 | 2.5 | 0.1 |
| Example 1-2 | AL2(50) | AM1(50) | 518 | 3.0 | 0.05 |
| Example 1-3 | AL3(50) | AM1(50) | 502 | 3.1 | 0.05 |
| Example 1-4 | AL4(50) | AM1(40) AM3(10) | 603 | 2.7 | 0.04 |
| Example 1-5 | AL(50) | AM2(25) AM4(25) | 720 | 2.5 | 0.12 |
| Example 1-6 | AL1(25) AL2(25) | AM1(25) AM2(25) | 751 | 2.3 | 0.14 |

Examples 2-1 to 2-6

As the base polymer, the following P1 to P4 were prepared.

P1: Polyvinyl alcohol (trade name: Gosenol GL-50, manufactured by Nihon Gosei Kogyo Co., Ltd.)

P2: Copolymer of methyl vinyl ether and maleic anhydride (1:1) (trade name: AN-119, manufactured by Gokyo Sangyo Co., Ltd.)

P3: Cresol novolak resin (manufactured by Gunei Kagaku Co., Ltd.)

P4: Poly(4-aminostyrene) (manufactured by Polyscinence Co.)

The base polymer as well as dialdehyde and diamine selected from the above respective groups described in Example 1 were formulated according to the formulation shown in Table 2, dissolved in NMP so that a concentration of the total amount of the solid components was set to 30% by weight, followed by filtering to prepare a coating solution. In Example 2-3, the amino group of the side chain of the base polymer P4 reacts with the dialdehyde and, therefore, no diamine was used. In any case, an amount of the aldehyde and amine were adjusted so that an aldehyde group and an amino group exist in an equimolar amount.

The resultant coating solution was spin-coated on a quartz substrate to form a film having a thickness of 1 μm. The respective films were heated. The results obtained by measuring an absorption wavelength and an absorbance at a specific wavelength region of these films after heating are shown in Table 2. As is apparent from the results of Table 2, the respective resin compositions perform color developing by heating.

TABLE 2

| | Base polymer (wt %) | Dialdehyde (wt %) | Diamine (wt %) | Absorption wavelength (nm) | Absorbance after heat treatment |
|---|---|---|---|---|---|
| Example 2-1 | P3 (50) | AL1 (26.9) | AM2 (23.1) | Whole visible region | 2.1–3.0 |
| Example 2-2 | P1(25) P2(25) | AL4 (27.7) | AM3 (22.3) | Whole visible region | 2.5–4.0 |
| Example 2-3 | P4 (47.0) | AL4 (53.0) | — | 515 | 2.0 |
| Example 2-4 | P3 (50) | AL2 (22.5) | AM1 (27.5) | 519 | 1.6 |
| Example 2-5 | P3 (50) | AL3 | AM4 | 600 | 1.9 |

TABLE 2-continued

| | Base polymer (wt %) | Dialdehyde (wt %) | Diamine (wt %) | Absorption wavelength (nm) | Absorbance after heat treatment |
|---|---|---|---|---|---|
| Example 2-6 | P3 (50) (50) | AL2 (21.6) (30.1) | AM3 (28.4) (19.9) | Whole visible region | 2.0–3.8 |

The transparent films formed as described above were peeled off. The respective transparent films were printed using a thermal printer. As a result, color developing was observed in all films.

Examples 3-1 to 3-4

As the photo-acid generator, the following AG-1 to AG-4 were prepared. As the acid crosslinking resin, the following CL1 was prepared. AG1 is manufactured by Lespechemical Co. AG2 is manufactured by Midori Kagaku Co., Ltd. AG3 and AG4 are manufactured by Toyo Gosei Co., Ltd.

AG1:

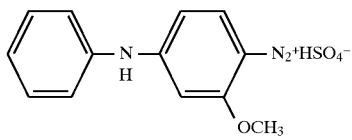

AG2:

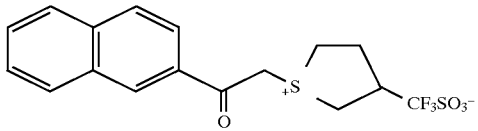

AG3: Naphthoquinonediazide-5-sulfonate of 2,3,4,4'-tetrahydroxybenzophenone

AG4: Naphthoquinonediazide-4-sulfonate of 2,3,4,4'-tetrahydroxybenzophenone

CL1: Melamine resin (trade name: Saimel 325, manufactured by Mitsui Saianamide Co., Ltd.)

The composition system used in Example 2, photo-acid generator and acid crosslinking resin were dissolved in NMP in the concentration shown in Table 3 to prepare a coating solution. Each of coating solutions was spin-coated on a silicon wafer to form a film having a thickness of 1 μm, which was baked at 90° C. for 5 minutes. The film was exposed by irradiating ultraviolet ray from a high-pressure mercury lamp through a predetermined mask, and then baked at 120° C. for 5 minutes. Then, the film was developed with a developing solution of NMP and IPA (isopropanol) (=7:3) to form a pattern. The sensitivity and resolution are shown in Table 3.

The resultant pattern was reacted with a 5 wt % sulfuric acid solution and a maximum absorption wavelength was measured. An absorbance was measured before and after reacting with sulfuric acid. These results are shown in Table 3. As is apparent from the results of Table 3, the absorbance of the pattern can be changed by the acid.

TABLE 3

| | Composition system (wt %) | Photo-acid generator (wt %) | Acid crosslinking resin (wt %) | Sensitivity (mJ/cm$^2$) | Resolution ($\mu$m) | Maximum absorption wavelength (nm) | Change in absorbance before sulfic acid action-after action |
|---|---|---|---|---|---|---|---|
| Example 3-1 | 2-2(20) | AG3(2) | CL1(2) | 110 | 5 | 520 | 0.05–2.5 |
| Example 3-2 | 2-1(20) | AG4(2) | CL1(2) | 150 | 3 | 650 | 0.08–2.3 |
| Example 3-3 | 2-4(20) | AG1(2) | CL1(2) | 220 | 8 | 600 | 0.02–2.4 |
| Example 3-4 | 2-6(20) | AG2(2) | CL1(2) | 300 | 12 | 750 | 0.10–2.0 |

Example 4

A solution of the resin composition of Example 3-2 was coated on a LCD substrate, on which an ITO transparent electrode has been formed, to form a film having a thickness of 1 $\mu$m. This film was exposed by irradiating ultraviolet ray with an irradiation dose of 110 mJ/cm$^2$ through a predetermined mask. After baking at 120° C. for 2 minutes, the film was developed to form a pattern corresponding to a red filter. Then, the resultant pattern was reacted with sulfuric acid to develop a red color, thereby forming a red filter. Also, a liquid crystal alignment film was formed. A liquid crystal cell was assembled by using the resulting substrate and an opposite substrate prepared separately, a liquid crystal was injected into the cell, and then polarizing plates were adhered to produce a liquid crystal device.

The resin composition used in this Example shows high sensitivity on exposure in comparison with a colored resist containing a red pigment. Therefore, a throughput of the color filter is improved.

Example 5

A solution of the resin composition of Example 3-4 was coated on a LCD substrate, on which an ITO transparent electrode has been formed, to form a film having a thickness of 1 $\mu$m. This film was exposed by irradiating ultraviolet ray with an irradiation dose of 30 mJ/cm$^2$ through a predetermined mask. After baking at 120° C. for 2 minutes, the film was developed to form a pattern corresponding to a black matrix. Then, the resultant pattern was reacted with sulfuric acid to develop a black color, thereby forming a black matrix. Also, a liquid crystal alignment film was formed. A liquid crystal cell was assembled by using the resulting substrate and an opposite substrate prepared separately, a liquid crystal was injected into the cell, and then polarizing plates were adhered to produce a liquid crystal device.

When a conventional black matrix of chrome is formed, exposing and developing of a resist and etching of chrome are required. To the contrary, a black matrix can be formed only by exposing and developing the resin composition in this Example. The resin composition used in this example shows high sensitivity on exposure and high resolution of the pattern formed in comparison with a colored resist containing a black pigment. Therefore, a throughput of the color filter is improved and a failure is also decreased.

Example 6

A solution of the polyimine of Example 1-2 was coated on a LCD substrate, on which an ITO transparent electrode has been formed, to form a film having a thickness of 1 $\mu$m. A resist (trade name: OFPR 800, manufactured by Tokyo Ohka Co., Ltd.) was coated on the film. This resist was exposed by irradiating ultraviolet ray with an irradiation dose of 50 mJ/cm$^2$ through a predetermined mask. After baking at 120° C. for 2 minutes and alkali developing, a resist pattern corresponding to a reverse pattern of a red filter was formed. Then, a polyimine film exposed from the resist pattern was reacted with sulfuric acid to develop a red color, thereby forming a red filter. According to the same manner, a green filter made from polyimine of Example 1-5 containing 15% polyimine of Example 1-2, and a blue filter made from polyimine of Example 1-6 were formed. Also, a liquid crystal alignment film was formed. A liquid crystal cell was assembled by using the resulting substrate and an opposite substrate prepared separately, a liquid crystal was injected into the cell, and then polarizing plates were adhered to produce a liquid crystal device.

Example 7

Recrystallized 2-aminopyrene (0.005 mol) as a monoamine, 2-naphthoaldehyde (0.005 mol) as a monoaldehyde, 10 g of a poly(styrene-vinylphenol) copolymer (3:7, manufactured by Maruzen Co., Ltd.) as the base polymer and phenylsulfonylacetonitrile (0.001 mol) as the heat-acid generator were dissolved in a three-fold amount of ethylcellosolve acetate solution. The resultant solution was filtered to prepare a coating solution. Phenylsulfonylacetonitrile has a function of improving a uniformity of coating. This coating solution was coated on a white substrate using a bar coater, followed by drying to form a film having a thickness of 20 $\mu$m. This film was heated by irradiating infrared laser light having a wavelength of 1 $\mu$m with a power of 0.3 W/cm$^2$ for 10 seconds. As a result, the irradiated part developed a black color.

Example 8

The polyimine obtained in Example 1-3 and polystyrene were dissolved in NMP in a concentration of 20% by weight and 5% by weight, respectively, to prepare a coating solution. The resultant coating solution was coated on a white substrate using a bar coater so that the film thickness became 5 $\mu$m, followed by drying.

This film was heated to 200° C. in an oven. As a result, it was found that the film developed an intense red color only during heating. This film was heated by irradiating infrared laser beam for a short time, followed by quenching. As a result, only the irradiated part selectively developed a red color. The color-developed film was heated again in an oven at 200° C. As a result, the whole surface developed a red color. Then, it returned to an original transparent color by cooling slowly. In such way, the transmission of the resin composition of this Example can be controlled by heating and cooling. By applying this phenomenon, the resin composition of this Example can be used as a recording material.

What is claimed is:

1. A color developing resin composition comprising a base polymer, a compound which produces an acid by light irradiating or heating and a compound having an azomethine bond formed by a condensation reaction between a dialdehyde and a diamine, wherein the compound having an azomethine bond is an oligomer or polymer having repeating units represented by the following chemical formula:

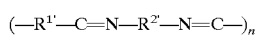

wherein $R^{1'}$ and $R^{2'}$ are each, independently, selected from the group consisting of aliphatic groups and aromatic groups having a formula selected from the group consisting of:

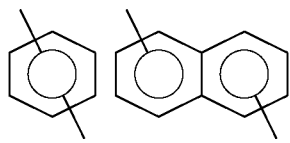

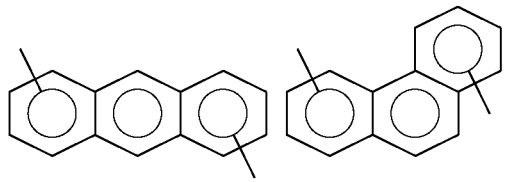

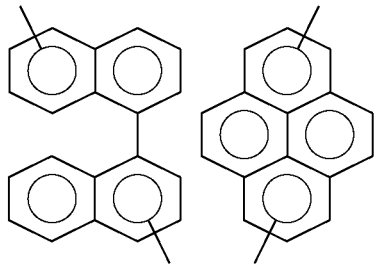

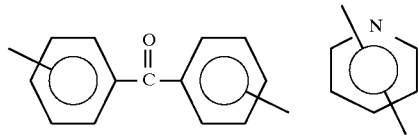

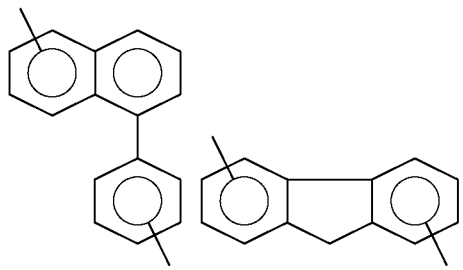

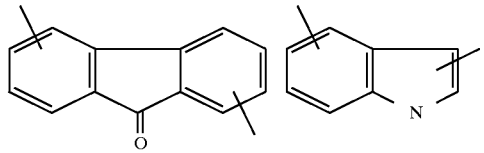

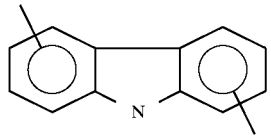

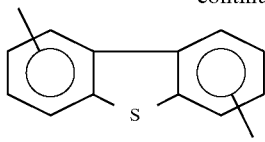

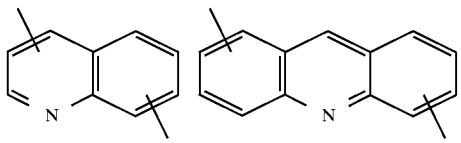

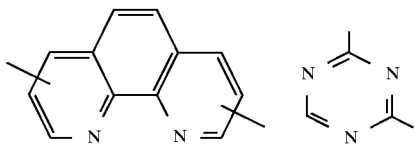

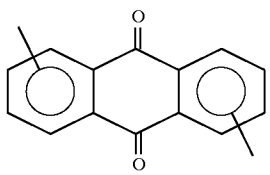

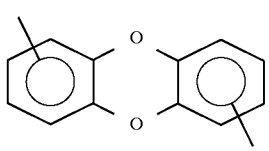

wherein one or more hydrogen atoms on the aromatic group may be substituted by a hydroxyl group or an alkyl group, and wherein n is at most 50.

2. The color developing resin composition according to claim 1, further comprising a resin which is to be crosslinked in the presence of the acid wherein said resin is different from said base polymer.

3. The color developing resin composition according to claim 1, further comprising a resin which is to be decomposed in the presence of the acid wherein said resin is different from said base polymer.

4. A color developing resin composition comprising:
   a base polymer;
   a polymer having an azomethine bond formed by a condensation reaction between an aldehyde and an amine wherein the aldehyde is 2-hydroxy-5-methylisophthalaldehyde and the amine is diaminodiphenyl ether;
   a compound which produces an acid by light irradiating or heating; and
   a resin different from the base polymer, which is to be crosslinked in the presence of the acid.

5. A color developing resin composition comprising:
   a base polymer;
   a polymer having an azomethine bond formed by a condensation reaction between an aldehyde and an amine, wherein the aldehyde is 2-hydroxy-5-methyliosphthalaldehyde and the amine is diaminodiphenyl ether;
   a compound which produces an acid by light irradiating or heating; and
   a resin different from the base polymer, which is to be decomposed in the presence of the acid.

* * * * *